(12) United States Patent
Tsai et al.

(10) Patent No.: US 11,488,925 B2
(45) Date of Patent: Nov. 1, 2022

(54) SEMICONDUCTOR PACKAGE STRUCTURE WITH HEAT SINK AND METHOD PREPARING THE SAME

(71) Applicant: SJ Semiconductor (Jiangyin) Corporation, JiangYin (CN)

(72) Inventors: Hanlung Tsai, JiangYin (CN); Chengchung Lin, JiangYin (CN); Mingchih Chen, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 33 days.

(21) Appl. No.: 17/195,389

(22) Filed: Mar. 8, 2021

(65) Prior Publication Data
US 2021/0280552 A1 Sep. 9, 2021

(30) Foreign Application Priority Data
Mar. 6, 2020 (CN) .......................... 202010152816.1
Mar. 6, 2020 (CN) .......................... 202020267066.8

(51) Int. Cl.
*H01L 23/00* (2006.01)
*H01L 21/56* (2006.01)
*H01L 23/31* (2006.01)
*H01L 23/29* (2006.01)

(52) U.S. Cl.
CPC .............. *H01L 24/43* (2013.01); *H01L 21/56* (2013.01); *H01L 23/3135* (2013.01); *H01L 24/45* (2013.01); *H01L 24/48* (2013.01); *H01L 24/49* (2013.01); *H01L 23/29* (2013.01); *H01L 23/296* (2013.01); *H01L 2224/4321* (2013.01); *H01L 2224/4382* (2013.01); *H01L 2224/4501* (2013.01); *H01L 2224/48105* (2013.01); *H01L 2224/48225* (2013.01); *H01L 2224/48464* (2013.01); *H01L 2224/49051* (2013.01)

(58) Field of Classification Search
CPC ................................................... H01L 23/3677
See application file for complete search history.

(56) References Cited

U.S. PATENT DOCUMENTS

| 2012/0032350 A1* | 2/2012 | Warren | H01L 24/49 257/782 |
| 2012/0061816 A1* | 3/2012 | Song | H01L 23/3677 257/E23.079 |
| 2022/0037224 A1* | 2/2022 | Yin | H01L 24/32 |

* cited by examiner

*Primary Examiner* — Yu-Hsi D Sun
(74) *Attorney, Agent, or Firm* — Alston & Bird LLP

(57) ABSTRACT

The present disclosure provides a chip package structure having a heat sink and a method making the same. The method includes: bonding a chip to a top surface of a package substrate and forming a heat-conducting lead having an arc-shape and placed on the chip in a vertical direction, a first end of the heat-conducting lead is connected with a surface of the chip, and a second end is connected with a solder ball; forming a plastic package material layer that protects the chip and the heat-conducting lead; forming a heat-conducting adhesive layer on the surface of the plastic package material layer, where the heat-conducting adhesive layer is connected with the solder ball on the second end of the heat-conducting lead; and forming a heat dissipation layer on a surface of the heat-conducting adhesive layer. With the present disclosure, the heat dissipation efficiency of the chip is effectively improved.

9 Claims, 5 Drawing Sheets

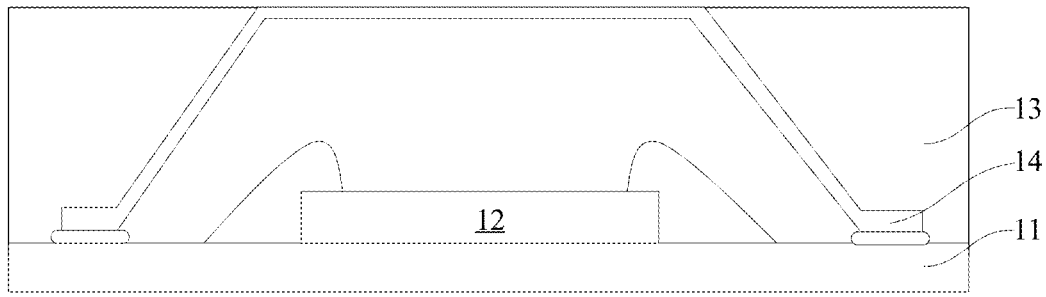

Fig. 1

```
┌─────────────────────────────────────────────────────────────┐
│ Providing a package substrate and a chip, bonding the chip  │
│ to a top surface of the package substrate, forming a        │
│ heat-conducting lead On the chip, the heat-conducting lead  │── S1
│ includes an arc-shaped vertical wire having a first end     │
│ and a second end opposite to the first end, the first end   │
│ is connected with a surface of the chip through a wire      │
│ bonding bump, and the second end is connected with a        │
│ solder ball                                                 │
└─────────────────────────────────────────────────────────────┘
                              ↓
┌─────────────────────────────────────────────────────────────┐
│ Disposing a plastic package material layer that packages    │
│ the chip and the heat-conducting lead, and a surface of the │── S2
│ plastic package material layer exposes the solder ball on   │
│ the second end of the heat-conducting lead                  │
└─────────────────────────────────────────────────────────────┘
                              ↓
┌─────────────────────────────────────────────────────────────┐
│ Forming a heat-conducting adhesive layer on the surface of  │
│ the plastic package material layer, wherein the             │── S3
│ heat-conducting adhesive layer is in contact with the       │
│ solder ball on the second end of the heat-conducting lead   │
└─────────────────────────────────────────────────────────────┘
                              ↓
┌─────────────────────────────────────────────────────────────┐
│ Forming a heat dissipation layer on a surface of the        │── S4
│ heat-conducting adhesive layer                              │
└─────────────────────────────────────────────────────────────┘
```

Fig. 2

SEMICONDUCTOR PACKAGE STRUCTURE WITH HEAT SINK AND METHOD PREPARING THE SAME

CROSS REFERENCE TO RELATED APPLICATIONS

The present application claims the benefit of priority to Chinese Patent Application No. CN2020101528161, entitled "Semiconductor Package Structure with Heat Sink and Method Making the same", filed with CNIPA on Mar. 6, 2020, and Chinese Patent Application No. CN2020202670668, entitled "Semiconductor Package Structure with Heat Sink", filed with CNIPA on Mar. 6, 2020, the content of which is incorporated herein by reference in their entireties.

TECHNICAL FIELD

The present disclosure relates to the technical field of chip packaging, in particular, to a chip package structure having a heat sink and a method making the same.

BACKGROUND

At the present time, rapid development of electronic information technology and the continuous improvement of users' expectation, the functions of a single electronic device have become increasingly diversified, at the same time a single electronic device's size has been continuously shrinking. Therefore, in the internal structure of an electronic equipment, densities of integrated circuit (IC) chips and functional components continue to increase and the critical dimensions (line/space widths, hole sizes, etc.) of these components continue to decrease, which have brought great challenges to the IC packaging industry.

Ball Grid Array (BGA) as a semiconductor IC packaging technology is widely used in the packaging market for shrinking ICs and has high density and multiple pins, has struggled to meet requirements for lighter, thinner, shorter, and smaller electronic products. However, since this chip packaging technique provides high-density electronic circuits and electronic components, the heat generated during operation is also high. Moreover, in BGA type of chip packaging, the semiconductor IC chip is packaged with a layer of encapsulant, referred to as Plastic Ball Grid Array (PBGA) package which has poor thermal conductivity. Therefore, the performance of the semiconductor chip is often affected by poor heat dissipation efficiency. To improve the heat dissipation efficiency of the chip package, a heat sink (or heat slug, heat block) may be added to the PBGA package structure.

FIG. 1 shows a commonly used PBGA package structure with a heat sink. This package structure takes into account the heat dissipation problem and adds the heat sink to the package structure, a heat sink 14 extends from a packaging substrate 11 to above a chip 12 through the support connection of several brackets. However, the problem with this structure is that the heat generated by the chip 12 needs to be conducted through a plastic packaging material layer 13 to reach the heat sink 14. The plastic packaging material layer 13 is usually made of resin and has poor thermal conductivity, resulting in a poor heat dissipation effect of the package structure. At the same time, this kind of package structure usually requires the mounting of the heat sink 14 after the chip 12 is bonded to the packaging substrate 11, and then the plastic packaging of the plastic material layer 13, which is usually cured by liquid plastic material. Therefore, the plastic packaging material is likely to overflow on the surface of the heat sink 14 during the plastic packaging process, resulting in a decrease in the heat dissipation effect of the heat sink 14, and ultimately resulting in poor heat dissipation of the packaged device and decreased electrical performance caused by poor heat dissipation.

SUMMARY

The embodiment of the present disclosure provides a method for making a chip package structure having a heat sink.

The method includes the steps: providing a package substrate and a chip; bonding the chip to a top surface of the package substrate; forming a heat-conducting lead on the chip, wherein the heat-conducting lead comprises an arc-shaped vertical wire having a first end and a second end opposite to the first end, wherein the first end is connected with a surface of the chip through a wire bonding bump and the second end is connected with a solder ball; disposing a plastic package material layer that packages the chip and the heat-conducting lead, wherein a surface of the plastic package material layer exposes the solder ball on the second end of the heat-conducting lead; forming a heat-conducting adhesive layer on the surface of the plastic package material layer, wherein the heat-conducting adhesive layer is in contact with the solder ball on the second end of the heat-conducting lead; and forming a heat dissipation layer on a surface of the heat-conducting adhesive layer.

In some examples, the heat-conducting adhesive layer is an electrically conductive material layer.

In some examples, the heat dissipation layer includes an uneven surface structure.

In some examples, the heat dissipation layer comprises a metal body layer and a coating layer on the metal body layer.

In some examples, the chip is bonded to the top surface of the package substrate by a bonding wire.

In some examples, the forming the heat-conducting lead having the arc-shaped vertical wire comprises: providing a bonding wire and a capillary, fixing a position of the bonding wire by the capillary, forming a solder ball at an end of the bonding wire, and soldering the solder ball to a bonding pad on a surface of the chip; generating a crack by forcing the capillary to deform a part where the bonding wire is connected to the solder ball; lifting the capillary up by a preset distance in a vertical direction, the preset distance defines a length of the heat-conducting lead, making the capillary reciprocate along an arc-shaped trajectory while keeping the capillary in the vertical direction, to generate an internal stress in the bonding wire of the preset distance; moving the capillary and the bonding wire in the vertical direction, breaking the bonding wire, forming the wire bonding bump, wherein the bonding wire under the capillary appears as an arc-shaped vertical line; forming the solder ball on the second end of the heat-conducting lead; soldering a top end of the bonding wire that appears as the arc-shaped vertical wire to the wire bonding bump by the capillary, wherein the bonding wire that appears as the arc-shaped vertical wire bends upward under an action of a soldering pressure; and forming the heat-conducting lead on the wire bonding bump by breaking the bonding wire through the capillary.

In some examples, the generating of the crack by forcing the capillary to deform the part where the bonding wire is connected to the solder ball comprises: moving the capillary upward in the vertical direction, and moving the capillary to the right or left in a horizontal direction, thereby generating the crack.

In some examples, the forming of the heat-conducting lead on the wire bonding bump by breaking the bonding wire through the capillary comprises: moving the capillary upward in the vertical direction, and pulling the bonding wire upward by the capillary until the bonding wire is broken, thereby forming the heat-conducting lead.

In some examples, the disposing the plastic package material layer further comprises: depositing the plastic package material on the top surface of the package substrate, exposed surfaces of the chip, and the heat-conducting lead; and grinding and removing the plastic package material to expose the solder ball on the second end of the heat-conducting lead, thereby forming the plastic package material layer for plastic packaging the chip and the heat-conducting lead.

Another embodiment of the disclosure provides a chip package structure having a heat sink, comprising: a package substrate; a chip, bonded to a top surface of the package substrate; a plastic package material layer, disposed on an exposed part of the top surface of the package substrate and a top surface of the chip; a heat-conducting adhesive layer, located on a top surface of the plastic package material layer; a heat dissipation layer, located on a top surface of the heat-conducting adhesive layer; and a heat-conducting lead having an arc-shape and placed on the chip in a vertical direction, wherein the heat-conducting lead includes a first end and a second end opposite to the first end, wherein the first end is connected with a surface of the chip through a wire bonding bump, the second end is connected with a solder ball, and the solder ball is connected with the heat-conducting adhesive layer.

In some examples, the chip is bonded to the top surface of the package substrate by a bonding wire, and wherein the bonding wire and the heat-conducting lead are made of a same material.

In some examples, the heat-conducting adhesive layer is an electrically conductive material layer.

In some examples, the heat dissipation layer includes an uneven surface structure.

In some examples, the heat dissipation layer comprises a metal body layer and a coating layer on the metal body layer.

As mentioned above, the chip package structure with the heat sink and the method preparing the same of the present disclosure have the following beneficial effects: by forming the heat dissipation layer on the outer surface of the plastic package material layer, the heat dissipation surface area of the heat dissipation layer is increased, and the heat-conducting lead transfers the heat from the chip to the heat dissipation layer of a larger area. Since the heat-conducting lead (metal material) has better thermal conductivity than the plastic package material layer (insulation material), the heat-conducting lead is set and combined with the heat dissipation layer of the large area, thereby effectively improving the heat dissipation efficiency of the chip. Besides, in the traditional wire bonding process, it is necessary to cut off excess leads and part of the package substrate to form the heat-conducting lead. The present disclosure directly forms the heat-conducting lead of the arc-shaped vertical wire without removing the bonding wire and part of the package substrate, which reduces process complexity, saves raw materials, and realizes the wire bonding process using existing machines and equipment, thereby effectively reducing manufacturing costs. Moreover, the heat-conducting lead is connected with the heat-conducting adhesive layer through the solder ball, which can further increase the contact area between the heat-conducting lead and the heat dissipation layer, and improve the heat dissipation efficiency.

BRIEF DESCRIPTION OF THE DRAWINGS

FIG. 1 shows a schematic view of a cross-sectional structure of a chip package structure in the related arts.

FIG. 2 shows a flow chart of a method for making a chip package structure with a heat sink according to the present disclosure.

FIGS. 3 to 11 show schematic cross-sectional views of the structures obtained after each step of the method for preparing a chip package structure with a heat sink according to the present disclosure, wherein FIGS. 4 to 7 show the schematic views of the process for preparing the heat-conducting lead "A" inside the dashed oval in FIG. 3, and FIG. 11 shows a schematic cross-sectional view of the final chip package structure with the heat sink according to the present disclosure.

DESCRIPTION OF REFERENCE NUMERALS

Figure 3:
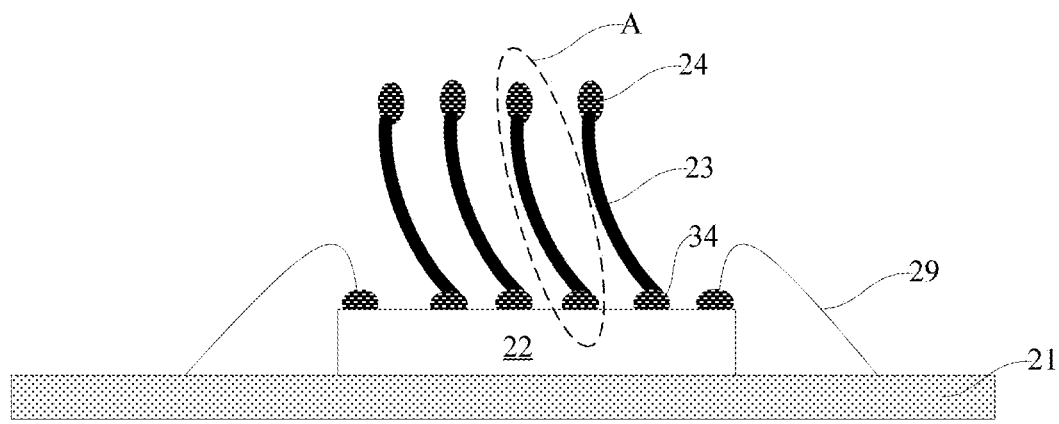
Figure 4:
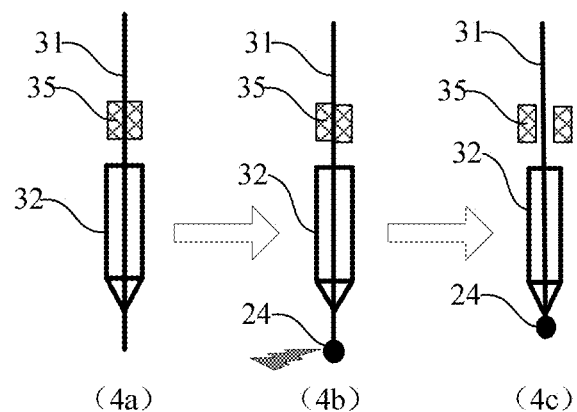
Figure 5:
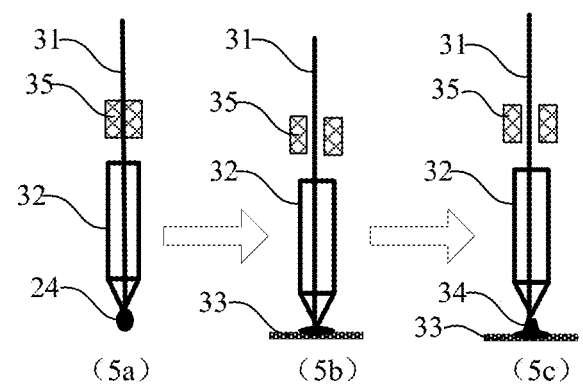

11 Package substrate
12 Chip
13 Plastic package material layer
14 Heat sink
21 Package substrate
22 Chip
23 Heat-conducting lead
24 Solder ball
25 Plastic package material
26 Plastic package material layer
27 Heat-conducting adhesive layer
28a Heat dissipation body layer
28b Heat dissipation coating layer
29 Bonding wire
31 Bonding wire
32 Capillary
33 Bonding pad
34 Wire bonding bump
35 wire clamp
S1-S4 Operations

DESCRIPTION OF THE SPECIFIC EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 2-11. It needs to be stated that the drawings provided in the following embodiments are just used for schematically describing the basic concept of the present disclosure, thus only illustrating components related to the present disclosure and are not drawn according to the numbers, shapes, and sizes of components during actual implementation, the configuration, number and scale of each component during the actual implementation thereof may be freely changed, and the component layout configuration thereof may be more complicated, and the "top" and "bottom" in this embodiment do not have a strictly limiting meaning but are only for the convenience of description.

Embodiment 1

Referring to FIG. 2, this embodiment provides a method for preparing a chip package structure with a heat sink, by forming the heat dissipation layer on the outer surface of the plastic package material layer, where the heat dissipation area of the heat dissipation layer is increased, and the heat-conducting lead transfers the heat from the chip to the heat dissipation layer of a large area. Since the heat-conducting lead (metal material) has better thermal conductivity than the plastic package material layer (insulation material), the heat-conducting lead is set and combined with the heat dissipation layer of the large area, thereby effectively improving the heat dissipation efficiency of the chip. Besides, in the traditional wire bonding process, it is necessary to cut off excess leads and part of the package substrate to form the heat-conducting lead. This embodiment forms directly the heat-conducting lead which is an arc-shaped vertical wire. The process is simple and no additional waste of materials occurs. The wire bonding process is realized using existing machines and equipment, which effectively reduces the manufacturing cost. Moreover, the heat-conducting lead is connected with the heat-conducting adhesive layer through the solder ball, which can further increase the contact area with the heat dissipation layer and improve the heat dissipation efficiency.

FIGS. 3 to 11 show schematic views of the steps preparing the chip package structure with the heat sink.

Referring to FIGS. 2 and 3, operation S1 is performed. A package substrate 21 is provided, a chip 22 is bonded to a top surface of the package substrate 21 to form a heat-conducting lead 23 of an arc-shaped vertical wire. The heat-conducting lead 23 includes a first end and a second end opposite to the first end, the first end is connected with the surface of the chip 22 through a wire bump 34, and the second end is connected with a solder ball 24.

The materials of the package substrate 21 can be selected according to different needs. For example, it can be nonmetallic materials such as silicon, glass, silicon oxide, ceramics, polymers, etc., or metal materials such as copper, or composite materials consisting of more than two elements. The shape of the package substrate 21 can be round, square, or another desired shape, and the surface area of the package substrate 21 is required to be able to support the subsequent structure on top. In this embodiment, for subsequent package needs, the surface area of the package substrate 21 is larger than the contacting surface area of the chip 22. For example, the area of the package substrate 21 is 1.1 to 2 times the contacting surface area of the chip 22.

As an example, the chip 22 may include various types of active or passive components, the number of which may be one or more. In this embodiment, the chip 22 is bonded to the package substrate 21 by wire bonding, that is, by a bonding wire 29. Two ends of the bonding wire 29 are respectively connected to the package substrate 21 and the chip 22, and a bonding pad (not shown) may be provided on the surface of the chip 22 to be connected to the bonding wire 29. The material of the bonding wire 29 is preferably gold, because a gold wire not only has good electrical conductivity and oxidation resistance, also has very good ductility and easy ball formation, thus helping to improve the performance of the chip package structure. In other examples, the chip 22 may be soldered on the package substrate 21 by die bonding, therefore the bonding technique is not strictly limited in this embodiment.

As an example, the bonding wire 29 and the heat-conducting wire 23 are made of the same material, such as the gold wire, so that the heat-conducting wire 23 and the bonding wire 29 may be formed in the same process, which is beneficial to the simplification of the preparation process. In other examples, the heat-conducting lead 23 may consist of other metallic materials with good thermal conductivity, such as copper, aluminum, copper alloys, etc., so the heat-conducting lead materials are not strictly limited in this embodiment. The heat generated by the chip 22 can be quickly transferred through the heat-conducting lead 23 to the heat-conducting adhesive layer 27 (to be formed later shown in FIG. 10), and eventually radiated out into the ambient through the heat dissipation layer formed on the heat-conducting adhesive layer 27. Compared to insulating materials, thermal conductivities of metal materials are generally better, as the heat-conducting lead 23 is used to increase the heat conduction path of the chip, so the heat dissipation efficiency of the chip 22 is effectively improved. Moreover, the top end of the heat-conducting lead 23 is connected to the solder ball 24, which further increases the contact area between the heat-conducting lead 23 and the the heat-conducting adhesive layer 27 (see FIG. 10), and reaching to heat dissipation layer 28a and 28b, thus improving the heat dissipation efficiency. It should be noted here that the number of the heat-conducting lead 23 and the bonding wire 29 may be multiple, such as 2 or more. The specific number can be set according to different product requirements, and is not limited here.

FIGS. 4 to 7 show the schematic views of the process for preparing the heat-conducting lead 23 "A" in the dashed oval in FIG. 3.

Referring to FIGS. 4a-4c and 5a-5c, a bonding wire 31, a capillary 32, and a wire clamp 35 are provided, a position of the bonding wire 31 is fixed by the capillary 32, a solder ball 24 is formed at an end of the bonding wire 31, and the solder ball 24 is soldered to a bonding pad 33 on a surface of the chip 22.

The above-mentioned operations specifically include: the welding wire 31 (as shown in 4a) is clamped by the capillary 32 and the wire clamp 35; an end of the bonding wire 31 is melted by an electric spark to form a solder ball 24 (as shown in 4b); the wire clamp 35 is loosed and the bonding wire 31 is moved upward so that the solder ball 24 is located at the end of the capillary 32 (as shown in 4c); the wire clamp 35 is closed again (as shown in 5a); the solder ball 24 is soldered on the solder pad 33 by the capillary 32 (as shown in 5b), the wire clamp 35 is loosed, and the capillary 32 is moved upwards in the vertical direction for a proper distance (as shown in 5c), a wire bonding bump 34 that is eutectic connected to the bonding pad 33 is formed on the bonding pad 33.

Figure 6:
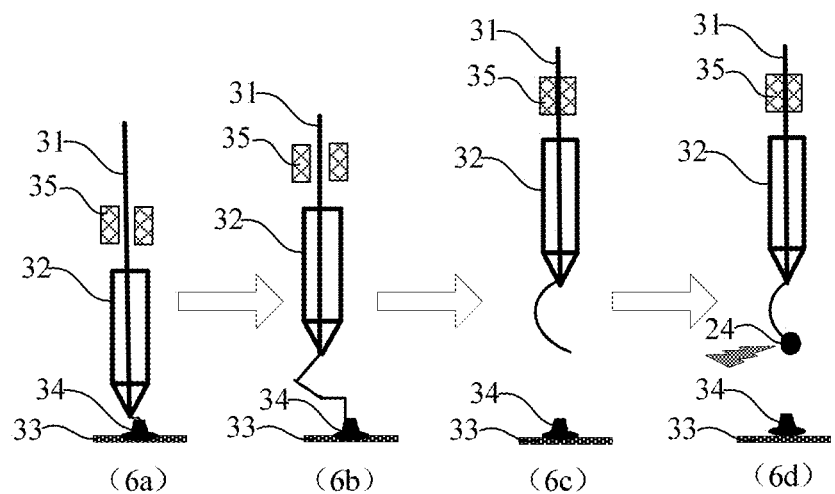

Referring to FIG. 6a in FIG. 6, the connecting part of the bonding wire 31 and the wire bonding bump 34 is deformed by the capillary 32 to generate a crack.

The above operations specifically include: the capillary 32 is moved upward in the vertical direction, and the capillary 32 is moved to the right or left in the horizontal direction, so that the connecting part of the bonding wire 31 and the wire bonding bump 34 is deformed to generate a crack.

Referring to FIG. 6b in FIG. 6, the capillary 32 is moved up a preset distance in a vertical direction, the preset distance defines a length of the future heat-conducting lead, while keeping the capillary 32 in the vertical direction, the capillary 32 reciprocates along an arc-shaped trajectory to make the bonding wire 31 of the preset distance generate internal stress and thus appear as an arc-shaped vertical line.

Referring to FIG. 6c in FIG. 6, the capillary 32 and the bonding wire 31 are moved in the vertical direction to break the bonding wire 31, thereby forming the wire bonding bump 34, and the bonding wire 31 under the capillary 32 appears as an arc-shaped vertical line. It should be noted that when the bonding wire 31 is pulled off, the wire clamp 35 is kept in a clamping state. A part of the arc of the shape of the welding wire 31 under the capillary 32 in FIG. 6c reduces length compared to that in FIG. 6b due to an upward pull force, but the shape of the bonding wire 31 below the capillary 32 in FIG. 6c can be precisely controlled to be an arc-shaped vertical wire by presetting the upward pull force, the parameters of which can be set according to the specific process, and there is no specific limit to these parameters here.

Referring to FIG. 6d in FIG. 6, the solder ball 24 is formed on the second end of the heat-conducting lead 23 at one end of the bonding wire 31 that appears as the arc-shaped vertical wire. Specifically, the end of the bonding wire 31 is melted by an electric spark to form the solder ball 24. It should be noted that when the solder ball 24 is formed, the wire clamp 35 is maintained in a clamping state.

Figure 7:
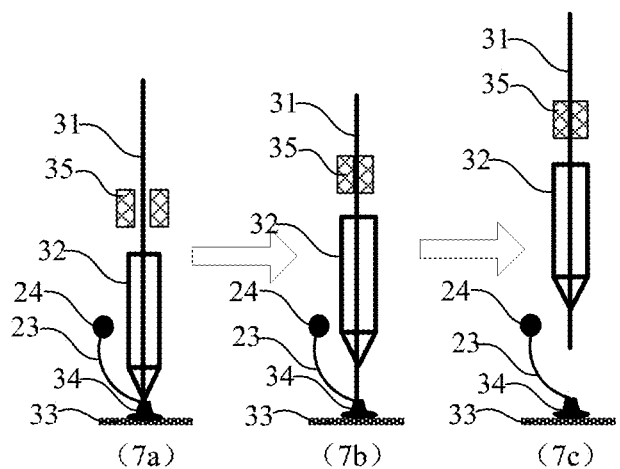

Referring to FIG. 7a in FIG. 7, the top end of the bonding wire 31 that appears as the arc-shaped vertical wire is soldered back to the wire bonding bump 34 by the capillary 32, and the bonding wire 31 that appears as the arc-shaped vertical wire bends upward to form the shape of the heat-conducting lead 23 in FIG. 3. It should be noted that during the soldering process, the wire clamp 35 remains loosened.

Referring to FIGS. 7b and 7c in FIG. 7, the heat-conducting lead 23 is formed on the wire bonding bump 34 by breaking the bonding wire 31 at its bottom through the capillary 32.

The above operations specifically include: the wire clamp 35 remains loosened, the capillary 32 is moved upward in the vertical direction, and the wire clamp 35 is clamped (as shown in 7b). Then, the bonding wire 31 is pulled upward by the capillary 32 until the bonding wire 31 is broken, thereby forming the heat-conducting lead 23.

Thus, a preparation cycle of the heat-conducting lead 23 is completed. In the traditional wire bonding process, it is necessary to cut off excess leads and part of the package substrate to form the heat-conducting lead. The above method of this embodiment directly forms the heat-conducting lead of the arc-shaped vertical wire without removing the bonding wire and part of the package substrate, which reduces process complexity, saves raw materials, and realizes the same wire bonding goal without using existing machines and equipment, thereby effectively reducing manufacturing costs. Moreover, the heat-conducting lead 23 is connected with the heat-conducting adhesive layer 27 through the solder ball 24, which can further increase the contact area between the heat-conducting lead 23 and the heat dissipation layer, thus improving the heat dissipation efficiency.

Figure 9:
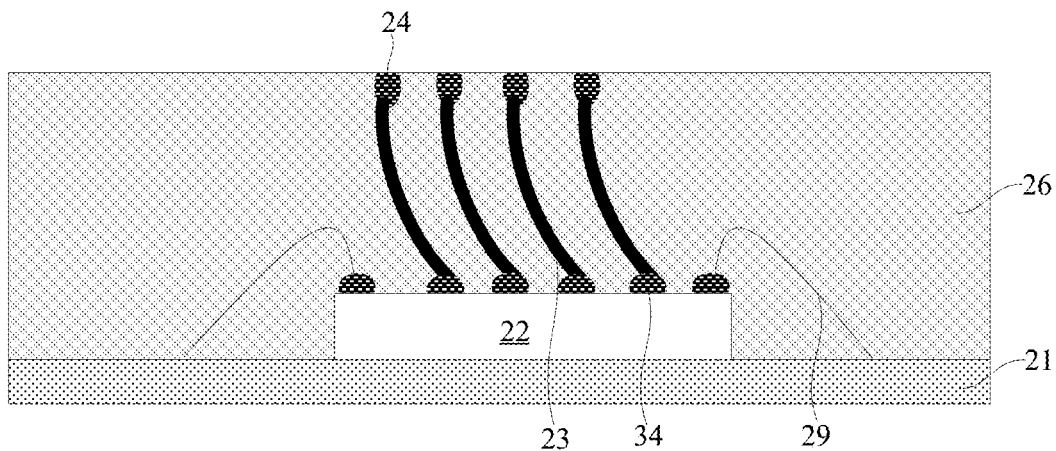

Referring to FIGS. 2 and 9, operation S2 is performed, a plastic package material layer 26 that packages the chip 22 and the heat-conducting lead 23 is formed, and a surface of the plastic package material layer 26 exposes the solder ball 24 on the second end of the heat-conducting lead 23.

Figure 8:
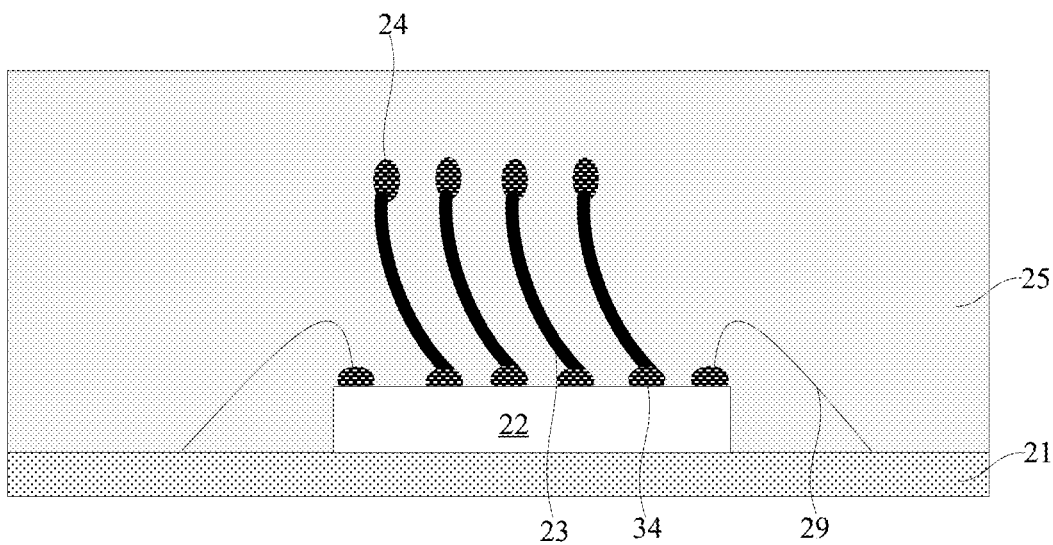

Referring to FIGS. 8-9, as an example, the forming of the plastic package material layer 26 includes: forming a plastic package material 25 on top surfaces of the package substrate 21, the chip 22, and the heat-conducting lead 23; and grinding and removing the plastic package material 25 to expose the solder ball 24 on the second end of the heat-conducting lead 23, thereby forming the plastic package material layer 26 for plastic packaging the chip 22 and the heat-conducting lead 23. (As shown in FIG. 9)

As an example, the material of the plastic package material layer 26 may include, but is not limited to, one or more of polyimide, silicone rubber, and epoxy resin. The process of forming the plastic package material layer 26 may include, but is not limited to, one or more of an inkjet process, a dispensing process, a compression molding process, a transfer molding process, a liquid sealing process, a vacuum lamination process, or a spin coating process.

Figure 10:
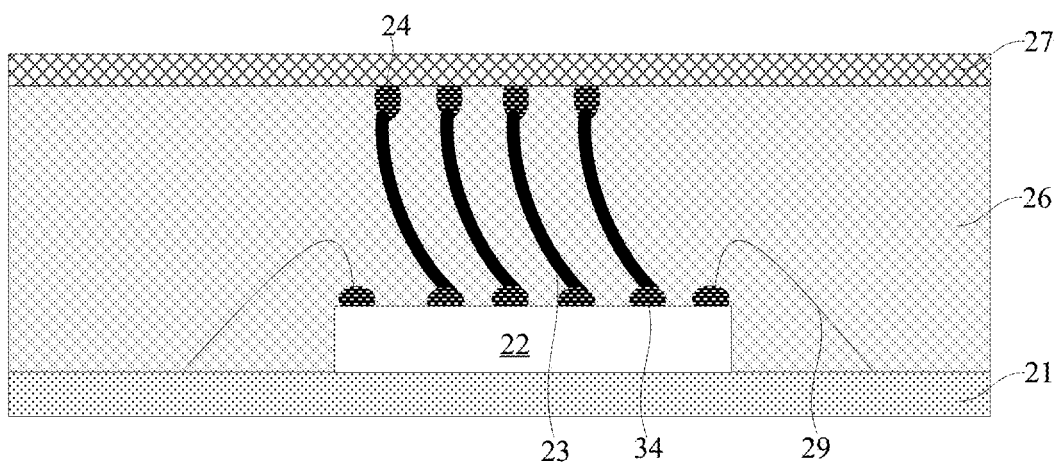

Referring to FIGS. 2 and 10, operation S3 is performed, a heat-conducting adhesive layer 27 is formed on the surface of the plastic package material layer 26, the heat-conducting adhesive layer 27 is connected with the solder ball 24 on the second end of the heat-conducting lead 23.

As an example, the heat-conducting adhesive layer 27 may be an insulating material layer, such as a silicone rubber layer. However, in this embodiment, the heat-conducting adhesive layer 27 is preferably a material layer with a conductive function, such as a conductive silver adhesive layer, so that the heat dissipation layer 28 is grounded through the heat-conducting adhesive layer 27, and the heat dissipation layer 28 can play the role of electromagnetic shielding while realizing the heat dissipation function, thereby improving the performance of the chip package device. The process of forming the heat-conducting adhesive layer 27 may include, but is not limited to, one or more of an inkjet process, a dispensing process, a compression molding process, a transfer molding process, a liquid sealing process, a vacuum lamination process, or a spin coating process. In this embodiment, the inkjet process or dispensing process is preferred, so that it is easier to form the heat-conducting adhesive layer 27 with a non-flat structure on the surface, so there are more choices in the subsequent process of forming the heat dissipation layer 28 with a non-flat surface structure. For example, the heat dissipation layer having a metal body layer 28a and a coating layer 28b on the metal body layer 28a can be formed by physical vapor deposition or electroplating. Because the heat-conducting adhesive layer 27 has a non-flat surface structure, the formed heat dissipation body layer 28a naturally has the non-flat surface structure, so that the heat dissipation body layer 28a has a larger heat dissipation surface area, which can avoid deformation caused by thermal expansion and/or adverse effects caused by stress. At the same time, the heat-conducting adhesive layer 27 and the heat dissipation layer 28a can be more closely attached, so that the heat of the chip 22 can be transferred to the heat dissipation layer 28 faster through the heat-conducting adhesive layer 27 and finally emitted to the external environment.

Figure 11:
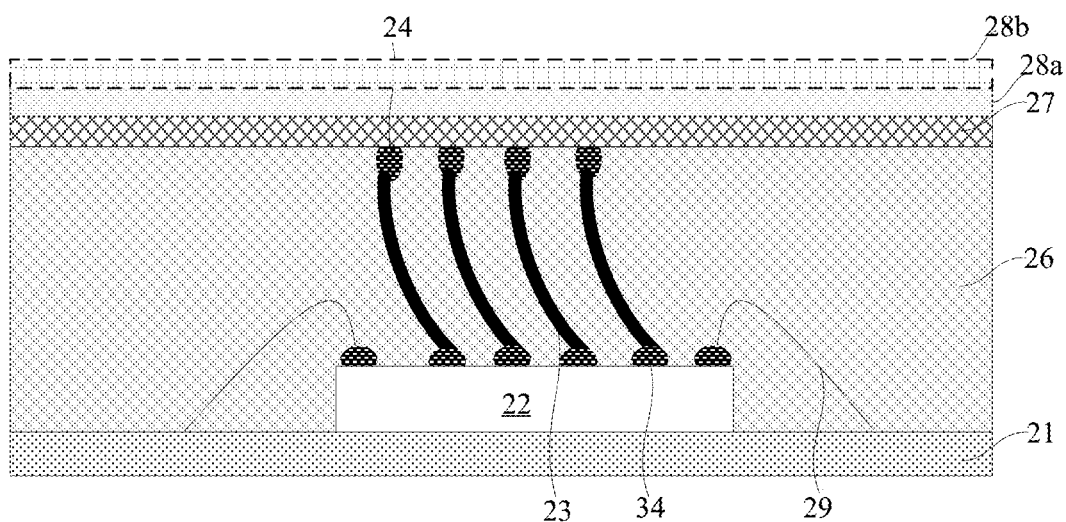

Referring to FIGS. 2 and 11, operation S4 is performed, a heat dissipation layer 28 is formed on the top surface of the heat-conducting adhesive layer 27.

As an example, the heat dissipation layer 28 may include any materials with good heat dissipation characteristics. In this embodiment, as an example, the heat dissipation layer includes a metal body layer 28a and a coating layer 28b on the metal body layer 28a as shown in FIG. 11. The metal body layer 28a may be a copper layer, an aluminum layer, a stainless steel layer, a copper alloy layer, or a composite layer of multiple metal layers. The coating layer may be a nickel layer, a chromium layer, or other coatings with good rust and corrosion resistance. The coating layer is used to protect the metal body layer 28a to prevent the metal body layer 28a from being oxidized and/or corroded, which causes the heat dissipation performance to decrease, and to ensure the heat dissipation performance of the heat dissipation body layer 28a. The surface area of the heat dissipation layer 28 is usually not less than the surface area of the plastic package material layer 26, that is, the heat dissipation layer 28a and 28b covers the plastic package material layer 26, and the edge of the heat dissipation layer 28 may be bent downward to wrap a part of the sidewalls of the plastic package material layer 26. This arrangement increases the heat dissipation area of the heat dissipation layer 28, increases the heat dissipation path of the chip package structure, and makes the connection between the heat dissipation layer 28 and the plastic package material layer 26 more stable, which improves the performance of the chip package structure.

In another example, the heat dissipation layer 28 includes a graphene layer. Graphene not only conducts electricity, but also has good heat dissipation properties, as well as good oxidation and corrosion resistance. Using graphene as the heat dissipation layer 28 can reduce the thickness of the heat dissipation layer 28, which is beneficial to the further miniaturization of the chip package device. If the heat dissipation layer 28 is a graphene layer, the heat dissipation layer 28 may be formed by a transfer molding method.

As an example, the heat dissipation layer 28 has a non-flat surface structure, that is, the surface of the heat dissipation layer 28 is not flat, for example, it may be a bumpy structure, or a corrugated structure, or any other irregular shape, which is not strictly limited in this embodiment. The surface of the heat dissipation layer 28 is set to be non-flat, on the one hand, the surface area of the heat dissipation layer 28 can be increased to make a larger heat dissipation area, on the other hand, the non-flat surface structure is provided to avoid expansion, deformation, and stress of the heat dissipation layer 28 when heated to ensure the performance of the chip package structure.

Embodiment 2

This embodiment provides a chip package structure with a heat sink. The package structure may be prepared by the method described in Embodiment 1, but is not limited to the method described in Embodiment 1, as long as the package structure can be formed. Referring to Embodiment 1 for the beneficial effects that the structure can achieve, which will not be described in detail below.

Referring to FIG. 11, the package structure includes: a package substrate 21; a chip 22, bonded to a top surface of the package substrate; a plastic package material layer 26, located on top surfaces of the package substrate 21 and the chip 22, and plastic packaging the chip 22; a heat-conducting adhesive layer 27, located on a top surface of the plastic package material layer 26; a heat dissipation layer having two parts 28a as the body part and 28b as the coating part, located on a top surface of the heat-conducting adhesive layer 27; and a heat-conducting lead 23 of an arc-shaped vertical wire, the heat-conducting lead 23 includes a first end and a second end opposite to the first end, the first end is connected with a surface of the chip 22 through a wire bonding bump 34, the second end is connected with a solder ball 24, and the solder ball 24 is connected with the heat-conducting adhesive layer 27.

As an example, the chip 22 is bonded to the top surface of the package substrate 21 by a bonding wire 29, and the bonding wire 29 and the heat-conducting lead 23 are made of the same material.

As an example, the heat-conducting adhesive layer 27 is a conductive material layer, for example, a conductive silver adhesive layer.

As an example, the heat dissipation layer 28 includes an uneven surface structure.

As an example, the heat dissipation layer 28 includes a metal body layer and a coating layer on the metal body layer.

In summary, the present disclosure provides a method for preparing a chip package structure with a heat sink, by forming the heat dissipation layer on the outer surface of the plastic package material layer, the heat dissipation area of the heat dissipation layer is increased, and the heat-conducting lead transfers the heat from the chip to the heat dissipation layer of a large area. Since the heat-conducting lead (metal material) has better thermal conductivity than the plastic package material layer (insulation material), the heat-conducting lead is set and combined with the heat dissipation layer of the large area, thereby effectively improving the heat dissipation efficiency of the chip. Besides, in the traditional wire bonding process, it is necessary to cut off excess leads and part of the package substrate to form the heat-conducting lead. The present disclosure directly forms the heat-conducting lead of the arc-shaped vertical wire without removing the bonding wire and part of the package substrate, which reduces process complexity, saves raw materials, and realizes the wire bonding process using existing machines and equipment, thereby effectively reducing manufacturing costs. Moreover, the heat-conducting lead is connected with the heat-conducting adhesive layer through the solder ball, which can further increase the contact area between the heat-conducting lead and the heat dissipation layer, and improve the heat dissipation efficiency. Therefore, the present disclosure effectively overcomes various shortcomings in the existing technology and has high industrial utilization value.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

The invention claimed is:

1. A method for making a chip package structure having a heat sink, comprising:
   providing a package substrate and a chip;
   bonding the chip to a top surface of the package substrate;
   forming a heat-conducting lead on the chip, wherein the heat-conducting lead comprises an arc-shaped vertical wire having a first end and a second end opposite to the first end, wherein the first end is connected with a surface of the chip through a wire bonding bump and the second end is connected with a solder ball;
   disposing a plastic package material layer that packages the chip and the heat-conducting lead, wherein a surface of the plastic package material layer exposes the solder ball on the second end of the heat-conducting lead;
   forming a heat-conducting adhesive layer on the surface of the plastic package material layer, wherein the heat-conducting adhesive layer is in contact with the solder ball on the second end of the heat-conducting lead; and
   forming a heat dissipation layer on a surface of the heat-conducting adhesive layer.

2. The method for making the chip package structure having the heat sink according to claim 1, wherein the heat-conducting adhesive layer is an electrically conductive material layer.

3. The method for making the chip package structure having the heat sink according to claim 1, wherein the heat dissipation layer includes an uneven surface structure.

4. The method for making the chip package structure having the heat sink according to claim 1, wherein the heat dissipation layer comprises a metal body layer and a coating layer on the metal body layer.

5. The method for making the chip package structure having the heat sink according to claim 1, wherein the chip is bonded to the top surface of the package substrate by a bonding wire.

6. The method for making the chip package structure having the heat sink according to claim 1, wherein the forming the heat-conducting lead having the arc-shaped vertical wire comprises:

providing a bonding wire and a capillary, fixing a position of the bonding wire by the capillary, forming a solder ball at an end of the bonding wire, and soldering the solder ball to a bonding pad on a surface of the chip;

generating a crack by forcing the capillary to deform a part where the bonding wire is connected to the solder ball;

lifting the capillary up by a preset distance in a vertical direction, the preset distance defines a length of the heat-conducting lead, making the capillary reciprocate along an arc-shaped trajectory while keeping the capillary in the vertical direction, to generate an internal stress in the bonding wire of the preset distance;

moving the capillary and the bonding wire in the vertical direction, breaking the bonding wire, forming the wire bonding bump, wherein the bonding wire under the capillary appears as an arc-shaped vertical line;

forming the solder ball on the second end of the heat-conducting lead;

soldering a top end of the bonding wire that appears as the arc-shaped vertical wire to the wire bonding bump by the capillary, wherein the bonding wire that appears as the arc-shaped vertical wire bends upward under an action of a soldering pressure; and forming the heat-conducting lead on the wire bonding bump by breaking the bonding wire through the capillary.

7. The method for making the chip package structure having the heat sink according to claim 6, wherein the generating of the crack by forcing the capillary to deform the part where the bonding wire is connected to the solder ball comprises: moving the capillary upward in the vertical direction, and moving the capillary to the right or left in a horizontal direction, thereby generating the crack.

8. The method for making the chip package structure having the heat sink according to claim 6, wherein the forming of the heat-conducting lead on the wire bonding bump by breaking the bonding wire through the capillary comprises: moving the capillary upward in the vertical direction, and pulling the bonding wire upward by the capillary until the bonding wire is broken, thereby forming the heat-conducting lead.

9. The method for making the chip package structure having the heat sink according to claim 1, wherein the disposing the plastic package material layer further comprises:

depositing the plastic package material on the top surface of the package substrate, exposed surfaces of the chip, and the heat-conducting lead; and grinding and removing the plastic package material to expose the solder ball on the second end of the heat-conducting lead, thereby forming the plastic package material layer for plastic packaging the chip and the heat-conducting lead.

\* \* \* \* \*